US008759955B2

(12) United States Patent
Iwamura et al.

(10) Patent No.: US 8,759,955 B2
(45) Date of Patent: Jun. 24, 2014

(54) SEMICONDUCTOR DEVICE WITH CHIPS ON ISOLATED MOUNT REGIONS

(71) Applicants: Hideyuki Iwamura, Ota (JP); Isao Ochiai, Ora-gun (JP)

(72) Inventors: Hideyuki Iwamura, Ota (JP); Isao Ochiai, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/745,330

(22) Filed: Jan. 18, 2013

(65) Prior Publication Data

US 2013/0187261 A1    Jul. 25, 2013

(30) Foreign Application Priority Data

Jan. 19, 2012  (JP) .................................. 2012-008952

(51) Int. Cl.
    *H01L 23/495* (2006.01)
(52) U.S. Cl.
    USPC ........... 257/670; 257/668; 257/674; 257/692; 257/723; 257/E23.039; 257/E23.046; 257/E23.052
(58) Field of Classification Search
    USPC ......... 257/666, 668, 670, 671, 672, 674, 692, 257/723, E23.039, E23.046, E23.052; 438/123
    See application file for complete search history.

(56) References Cited

U.S. PATENT DOCUMENTS

| 6,307,272 | B1 * | 10/2001 | Takahashi et al. | 257/787 |
| 6,650,004 | B1 * | 11/2003 | Horie et al. | 257/666 |
| 6,800,932 | B2 * | 10/2004 | Lam et al. | 257/706 |
| 7,208,818 | B2 * | 4/2007 | Luo et al. | 257/666 |
| 7,511,966 | B2 * | 3/2009 | Noguchi | 361/771 |
| 7,812,464 | B2 * | 10/2010 | Hirashima et al. | 257/796 |
| 2003/0137813 | A1 * | 7/2003 | Onizuka et al. | 361/777 |
| 2006/0081967 | A1 * | 4/2006 | Ha et al. | 257/676 |
| 2010/0164078 | A1 * | 7/2010 | Madrid et al. | 257/675 |
| 2010/0219519 | A1 * | 9/2010 | Owyang et al. | 257/676 |

FOREIGN PATENT DOCUMENTS

| JP | 63-187353 | 11/1988 |
| JP | 2006-245618 | 9/2006 |

\* cited by examiner

*Primary Examiner* — Thanh V Pham

(57) ABSTRACT

Conventional semiconductor devices have a problem that it is difficult to prevent the short circuit between chips and to improve accuracy in temperature detection with the controlling semiconductor chips. In a semiconductor device of the present invention, a first mount region to which a driving semiconductor chip is fixedly attached and a second mount region to which a controlling semiconductor chip is fixedly attached are formed isolated from each other. A projecting area is formed in the first mount region, and the projecting area protrudes into the second mount region. The controlling semiconductor chip is fixedly attached to the top surfaces of the projecting area and the second mount region by use of an insulating adhesive sheet material. This structure prevents the short circuit between the two chips, and improves accuracy in temperature detection with the controlling semiconductor chip.

6 Claims, 7 Drawing Sheets

SEMICONDUCTOR DEVICE WITH CHIPS ON ISOLATED MOUNT REGIONS

This application claims priority from Japanese Patent Application No. 2012-008952 filed on Jan. 19, 2012, the contents of which are incorporated herein by reference in its entirety.

BACKGROUND OF THE INVENTION

1. Field of the Invention

The present invention relates to a semiconductor device in which a driving semiconductor chip and a controlling semiconductor chip for controlling the driving semiconductor chip are incorporated in a semiconductor package for use, for example, in an on-board igniter.

2. Description of the Related Art

The following structure has been known as an example of conventional semiconductor devices.

As shown in FIG. 7, a semiconductor element 63 and chip capacitors 64 are fixedly attached to the top of a stage 62 formed of a lead frame in a semiconductor device 61. The stage 62 is formed larger than the semiconductor element 63. The chip capacitors 64 are mounted outside the semiconductor element 63 on the stage 62. In each of the mount regions of the chip capacitors 64, a recessed portion 65 is formed by half-etching the stage 62 from its top surface. As illustrated, an insulating tape 66 such as a polyimide tape is placed inside the recessed portion 65. The chip capacitor 64 is fixedly attached to the top of the insulating tape 66. This structure prevents the chip capacitors 64 from being short-circuited to the corresponding semiconductor element 63 via the stage 62. This technology is described, for instance, in Japanese Patent Application Publication No. 2006-245618 (pp. 4 to 5, and FIGS. 5 to 8).

In addition, the following structure has been known as another example of the conventional semiconductor devices.

As shown in FIG. 8, an IC (integrated circuit) chip 72 is fixedly attached to the principal surface of a tab 71 of the two divided tabs, while electronic parts 74 are fixedly attached to the principal surface of the other tab 73. The structure in which the tabs 71, 73 are at least divided from each other prevents the electronic parts 74 from being short-circuited to the IC chip 72 via the tabs 71, 73. As shown with dotted hatching, an insulating film 75 may be formed on the principal surface of the other tab 73. This technology is described, for instance, in Japanese Utility Model Registration Application Publication No. Sho 63-187353 (pp. 4 to 5, and FIGS. 1 to 2) in a microfilm form.

SUMMARY OF THE INVENTION

A resin package of the on-board igniter includes, for example, a driving semiconductor chip as a switching element and a controlling semiconductor chip for controlling the driving semiconductor chip. The driving semiconductor chip includes an embedded larger-current element such as an IGBT (insulated gate bipolar transistor). The controlling semiconductor chip includes a temperature detecting element and a thermal shutdown circuit, and is placed near the driving semiconductor chip. The controlling semiconductor chip detects the temperature of the driving semiconductor chip. When detecting a temperature higher than a preset value, the controlling semiconductor chip forcibly makes the driving semiconductor chip perform an OFF operation, and thereby prevents the temperature of the driving semiconductor chip from rising abnormally and prevents the driving semiconductor chip from catching fire.

In this case, if the driving semiconductor chip and the controlling semiconductor chip are placed on the same island as shown in FIG. 7, the temperature rising state of the driving semiconductor chip can be accurately detected. Although the use of the insulating tape prevents the short circuit between the two semiconductor chips, the structure in which the two semiconductor chips are placed on the same island poses a problem that the two semiconductor chips are more likely to be short-circuited to each other due to processing errors in the manufacturing, such as errors in position recognition during the insulating tape applying step and the die bonding step.

Furthermore, in the structure in which the two semiconductor chips are placed on the same island, the potential of the island is equal to the potential applied to the driving semiconductor chip. For this reason, if a different potential is intended to be applied to the controlling semiconductor chip, the lead needs to be patterned up to the vicinity of the island. This patterning poses another problem of limiting the freedom in pattern design.

On the other hand, the structure in which the tabs are divided from each other as shown in FIG. 8 poses yet another problem that conditions for processing the lead frame make it difficult to reduce the distance between the driving semiconductor chip and the controlling semiconductor chip beyond some extent. In addition, since the controlling semiconductor chip detects the temperature rising state of the driving semiconductor chip through the resin forming the resin package in most cases, this structure poses still another problem that a relationship in thermal conductivity between the materials makes it difficult to accurately detect the rise in the temperature of the driving semiconductor chip.

The present invention has been made in view of the above-described circumstances. A semiconductor device of the present invention is a semiconductor device including: a first mount region; a second mount region placed near the first mount region, and formed isolated from the first mount region; leads placed near the first and second mount regions; a first semiconductor chip fixedly attached to a top of the first mount region; a second semiconductor chip fixedly attached to tops of the respective first and second mount regions, and configured to control the first semiconductor chip; a resin sealing body covering the first and second mount regions, the leads, and the first and second semiconductor chips, in which a projecting area protruding into the second mount region is formed in the first mount region, and the second semiconductor chip is fixedly attached to the tops of the first and second mount regions by use of an insulating adhesive sheet material in a way that at least part of the projecting area is placed under the second semiconductor chip.

DETAILED DESCRIPTION OF THE INVENTION

Figure 1:
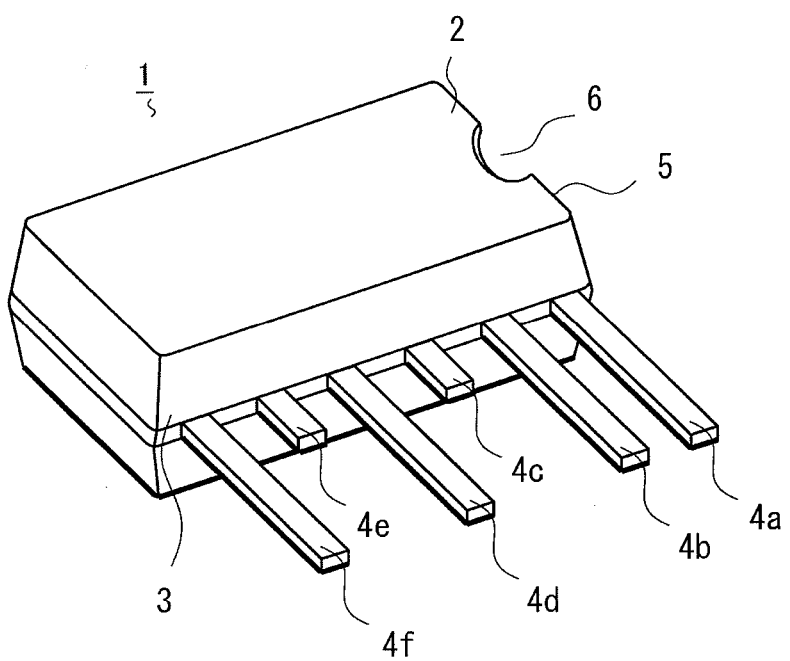
FIG. 1 is a perspective view for explaining a semiconductor device of a first embodiment of the present invention.
Figure 2A:
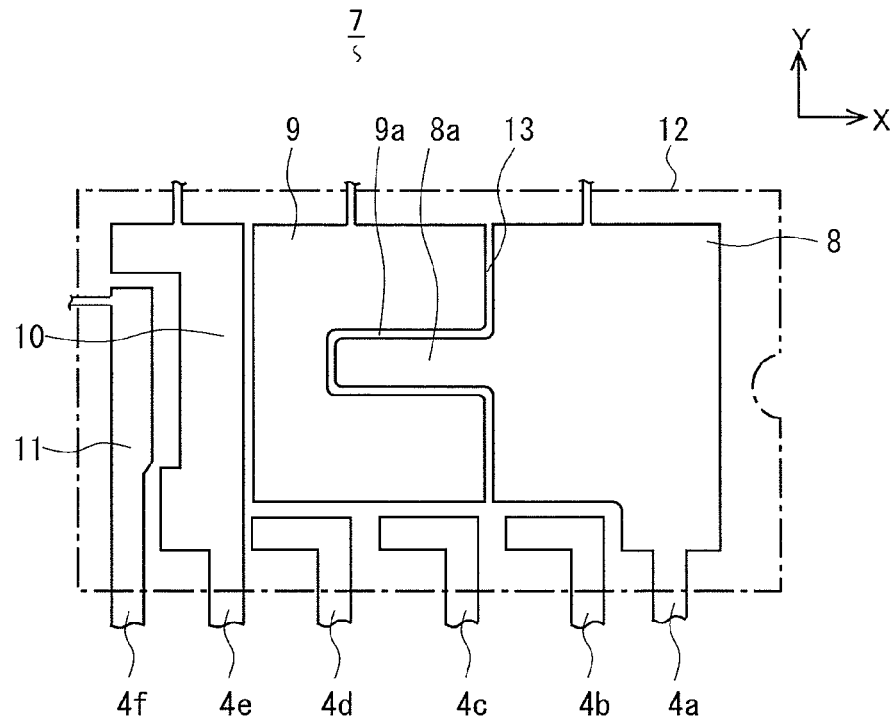
FIGS. 2A and 2B are plan views for explaining the semiconductor device of the first embodiment of the present invention.
Figure 2B:
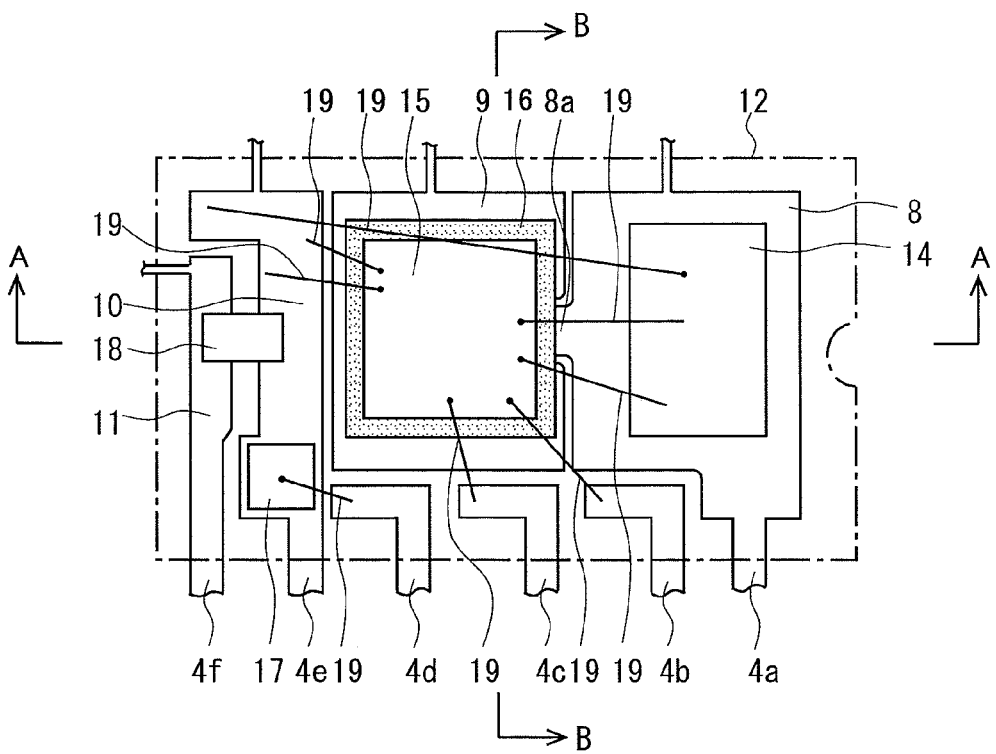
Figure 3A:
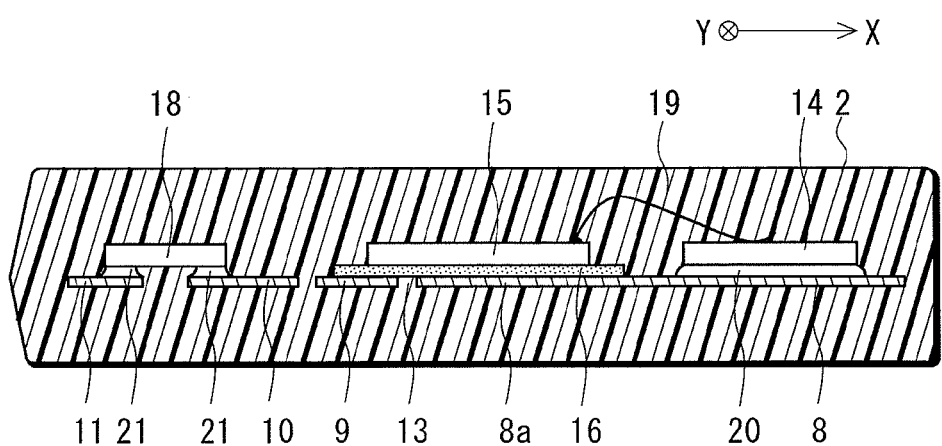
FIGS. 3A and 3B are cross-sectional views for explaining the semiconductor device of the first embodiment of the present invention.
Figure 3B:
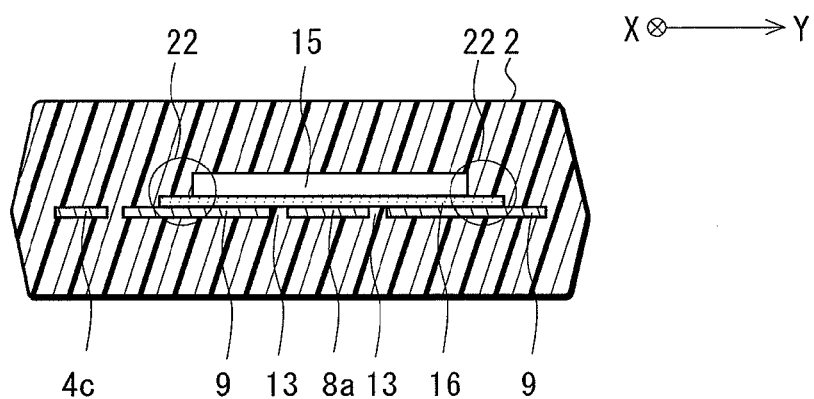

Descriptions will be hereinbelow provided for a semiconductor device of a first embodiment of the present invention. FIG. 1 is a perspective view of the semiconductor device taken from the top surface of the semiconductor device. FIG. 2A is a plan views for explaining a frame structure used for the semiconductor device shown in FIG. 1. FIG. 2B is a plan view for explaining an inner structure of the semiconductor device shown in FIG. 1. FIG. 3A is a cross-sectional view for explaining the semiconductor device taken along the A-A line of FIG. 2B. FIG. 3B is a cross-sectional view for explaining the semiconductor device taken along the B-B line of FIG. 2B.

As shown in FIG. 1, a resin package 2 of a semiconductor device 1 is shaped like a rectangular parallelepiped. Multiple leads 4a to 4f are drawn out from a longitudinal side surface 3 of the resin package 2. On the other hand, a U-shaped hole 6 as a screw stopper is placed in a side surface 5 of the resin package 2 which extends in a short length direction thereof. Note that, albeit unillustrated, the leads 4 are bent in a right-angled shape, and fixed to the mount board inside a through-hole by soldering.

FIG. 2A shows a frame 7 which is placed inside the resin package 2. Generally, a frame made from a material essentially containing copper is used as the frame 7. Otherwise, a frame made from a material essentially containing Fe may be used as the frame 7. In addition, the thickness of the frame 7 is 200 μm, for example. Furthermore, first to fourth mount regions 8, 9, 10, 11 and the multiple leads 4a to 4f, for example, are defined by performing etching, blanking, and other processes on the frame 7. Note that a chain line 12 indicates the external form line of the resin package 2.

As illustrated, the first mount region 8 is formed integrated with the lead 4a in a Y-axis direction in the drawing. In addition, the first mount region 8 includes a projecting area 8a formed in a shape protruding into the second mount region 9 in an X-axis direction in the drawing. The projecting area 8a is isolated from the second mount region 9 by an isolation groove 13. Moreover, the projecting area 8a has a structure which extends up to under a semiconductor chip 15 (see FIG. 2B) fixedly attached to the second mount region 9. It is desirable that the projecting area 8a should protrude by at least a half of the width (i.e., the width in the X-axis direction) of the second mount region 9.

On the other hand, the second mount region 9 includes a recessed area 9a formed in a shape recessed to surround the projecting area 8a in the X-axis direction in the drawing. Furthermore, because the semiconductor chip 15 fixedly attached to the second mount region 9 is placed over the recessed area 9a, the width (i.e., the width in the Y-axis direction) of the recessed area 9a is narrower than the width of the semiconductor chip 15. To serve this purpose, the recessed area 9a only needs to surround at least part of the projecting area 8a with the width of the isolation groove 13 adjusted.

The multiple leads 4a to 4f are placed to be drawn out from the side surface 3 of the resin package 2. Moreover, the leads 4b to 4d are placed near the first and second mount regions 8, 9. The lead 4e is formed integrated with the third mount region 10, and the lead 4f is formed integrated with the fourth mount region 11.

It should be noted that the frame 7 is plated with Pd, Ag, Ni/Pd/Ag, or the like.

FIG. 2B shows the frame to which the semiconductor chips and the like are fixedly attached. As a switching element (a driving element), a discrete semiconductor chip 14 having a built-in IGBT, for example, is fixedly attached to the first mount region 8 by use of an adhesive 20 such as Ag paste, solder or the like (see FIG. 3A).

The semiconductor chip 15 having a built-in LSI element for controlling the semiconductor chip 14 is fixedly attached to the second mount region 9 by use of an insulating adhesive sheet material 16. A thermal shutdown circuit is formed by placing, for example, a thermal detection element on the top surface of the semiconductor chip 15. The semiconductor chip 15 detects the temperature rising state of the semiconductor chip 14, and forcibly shuts down the semiconductor chip 14 if the temperature of the semiconductor chip 14 rises beyond a set temperature.

It should be noted that the adhesive sheet material 16 may be placed to additionally cover the above of the isolation groove 13 and extends onto the first mount region 8. In this case, the flatness between the first mount region 8 and the second mount region 9 is easily maintained by the adhesive sheet material 16, and the second semiconductor chip 15 is fixedly attached thereto stably as well. Furthermore, yields in the wire bonding process increase because the failure in connecting thin metallic wires occurs less often.

A semiconductor chip 17 is fixedly attached to the third mount region 10 by use of a conductive adhesive, and a chip capacitor 18 is fixedly attached to the third and fourth mount regions 10, 11 by use of an adhesive 21 (see FIG. 3A), such as Ag paste or solder. As illustrated, the semiconductor chips 14, 15 and the like are electrically connected together by use of thin metallic wires 19. Thereby, the resin package 2 for an on-board igniter, for example, which includes the thermal shutdown circuit, is formed.

FIG. 3A shows the cross section of the resin package 2 taken along the A-A line (see FIG. 2B). The semiconductor chip 14 is fixedly attached to the top of the first mount region 8 by the adhesive 20, while the semiconductor chip 15 is fixedly attached to the top of the projecting area 8a of the first mount region 8 and the top of the second mount region 9 by use of the adhesive sheet material 16. In addition, the adhesive sheet material 16 is formed from an insulating material having an adhesive property, such as a polyimide tape, a silicone tape or a DAF (Die Attach Film) material. By using the polyimide tape as the adhesive sheet material 16, the thickness of the adhesive sheet material 16 can be made thinner and the temperature detection sensitivity of the adhesive sheet material 16 can be increased. Incidentally, the chip capacitor 18 is fixedly attached to the third and fourth mount regions 10, 11 by use of the adhesive 21.

As illustrated, heat produced by the semiconductor chip 14 transmits to the first mount region 8, and further transmits to the lower portion of the semiconductor chip 15 via the projecting area 8a. Since the frame 7 is formed from the material essentially containing copper, the frame 7 is better in thermal conductivity than the resin material from which the resin package 2 is made. This structure enables the semiconductor chip 15 to detect the temperature rising state of the semiconductor chip 14 through the frame 7 as well. Accordingly, the temperature condition of the semiconductor chip 14 can be detected more accurately. If the temperature of the semiconductor chip 14 rises abnormally, the semiconductor chip 14 is shut down immediately so as not to catch fire.

Moreover, the area of the frame 7 which is better in thermal conductivity is increased by making the projecting area 8a protrude by at least a half of the width (i.e., the width in the X-axis direction) of the semiconductor chip 15. Accordingly, the semiconductor chip 15 is capable of detecting the temperature condition of the semiconductor chip 14 more accurately. In addition, in the projecting area 8a, since the adhesive sheet material 16 is placed at least in the area to which the semiconductor chip 15 is fixedly attached, the semiconductor chip 15 is prevented from being short-circuited to the semiconductor chip 14 through the projecting area 8a.

FIG. 3B shows the cross section of the resin package 2 taken along the B-B line (see FIG. 2B). The semiconductor chip 15 is fixedly attached to the top of the projecting area 8a of the first mount region 8 and the top of the second mount region 9 by use of the adhesive sheet material 16. Furthermore, because as indicated with circles 22, the adhesive sheet material 16 is placed up to the outside of the end portions of the semiconductor chip 15, the problem of the above-mentioned short circuit does not occur.

Moreover, the fixed attachment of the semiconductor chip 15 is achieved by placing the semiconductor chip 15 on the adhesive sheet material 16 after placing the adhesive sheet material 16 on the top surfaces of the first and second mount regions 8, 9. Even if the end portion of the semiconductor chip 15 comes closer to or in contact with the second mount region 9 due to errors in position recognition and the like during the manufacturing process, the problem of the above-mentioned short circuit does not occur since the first and second mount regions 8, 9 are isolated by the isolation groove 13.

With regard to this embodiment, the descriptions have been provided particularly for the case where no potential is applied to the second mount region 9. However, the embodiment is not limited to this case. For example, an embodiment may be carried out by using the second mount region 9 as the ground potential of the semiconductor chip 15. In this case, the design freedom of the frame patterning is enhanced because the number of leads placed near the second mount region 9 is reduced.

Figure 4A:
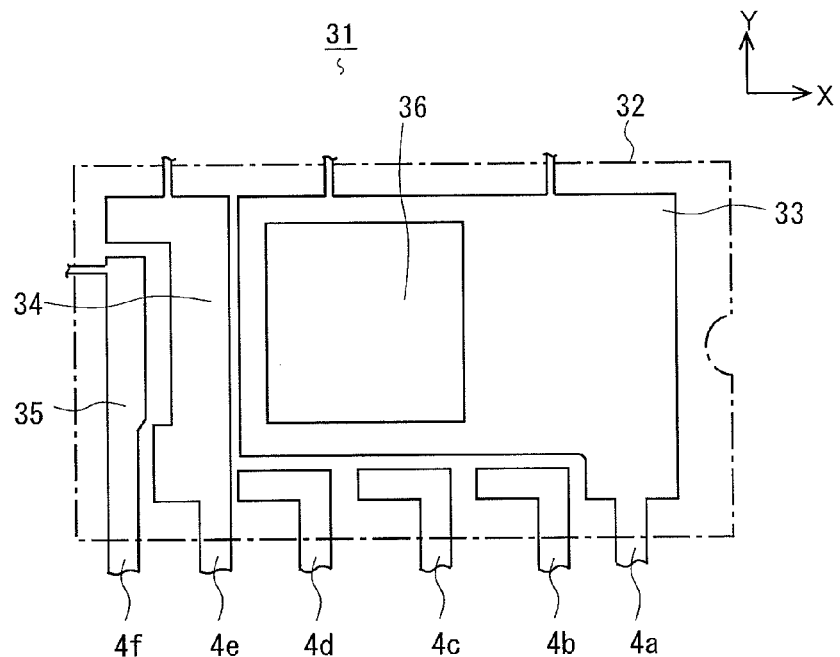
FIGS. 4A and 4B are plan views for explaining a semiconductor device of a second embodiment of the present invention.
Figure 4B:
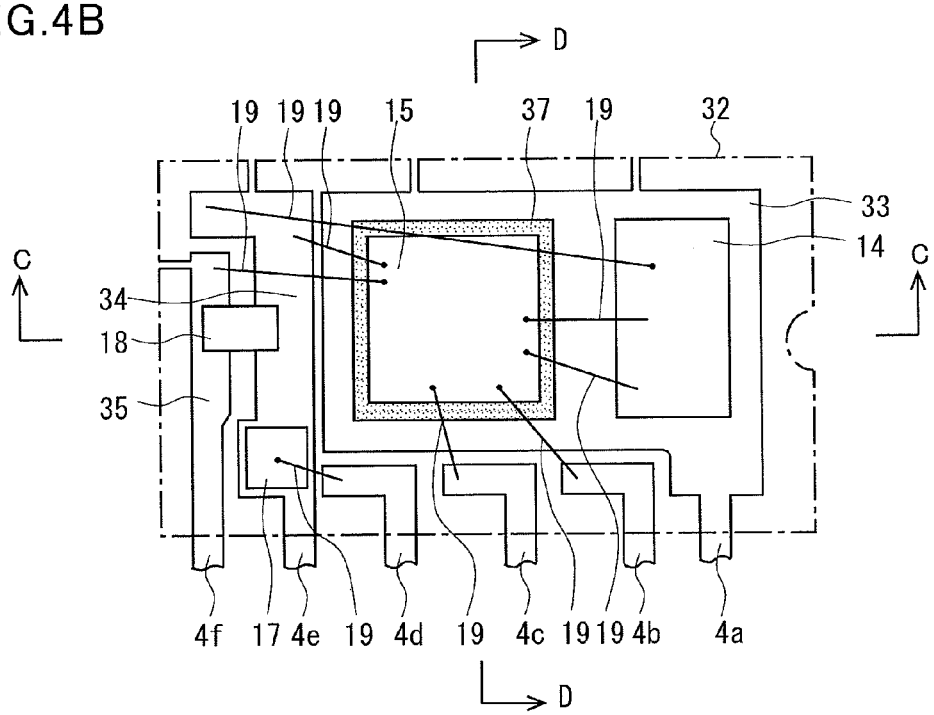
Figure 5A:
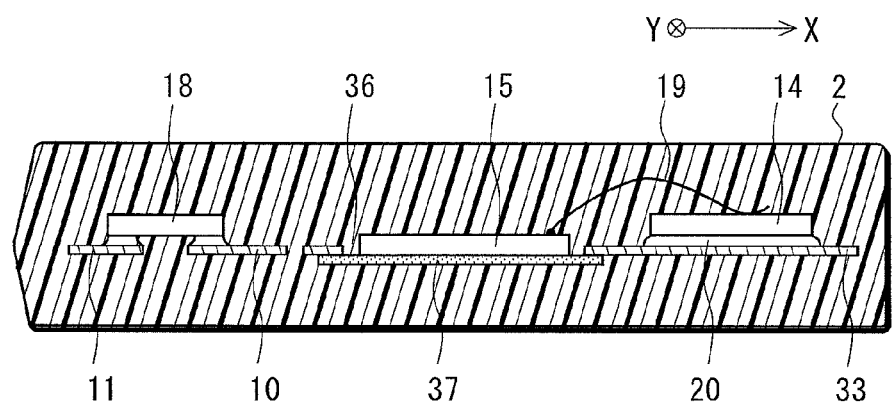
FIGS. 5A and 5B are cross-sectional views for explaining the semiconductor device of the second embodiment of the present invention.
Figure 5B:
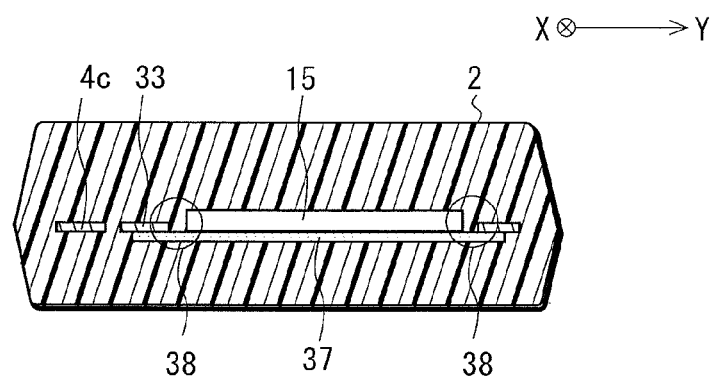

Next, descriptions will be provided for a semiconductor device of a second embodiment of the present invention. FIG. 4A is a plan view for explaining a frame structure used for the semiconductor device shown in FIG. 1. FIG. 4B is a plan view for explaining an internal structure of the semiconductor device shown in FIG. 1. FIG. 5A is a cross-sectional view for explaining the internal structure thereof taken along the C-C line of FIG. 4B. FIG. 5B is a cross-sectional view for explaining the internal structure thereof taken along the D-D line of FIG. 4B. Incidentally, in the second embodiment, components which are the same as those of the first embodiment will be denoted by the same reference numerals. The descriptions of such components are referred to by the reference numerals, and are omitted here.

FIG. 4A shows a frame 31 placed inside a resin package 2, which is indicated with a chain line 32. Generally, a frame made from a material essentially containing copper is used as the frame 31 in common with the frame 7. However, a frame made from a material essentially containing Fe may be used as the frame 31. As illustrated, first to third mount regions 33 to 35 and multiple leads 4a to 4f, for example, are defined by performing etching, blanking, and other processes on the frame 31.

It should be noted that in this embodiment, the first mount region 33 is formed in a shape which represents the integral combination of the first and second mount regions 8, 9 of the first embodiment; the second mount region 34 corresponds to the third mount region 10 of the first embodiment; and the third mount region 35 corresponds to the fourth mount region 11 of the first embodiment.

As illustrated, the first mount region 33 is formed integral with the lead 4a in a Y-axis direction in the drawings. In addition, an opening 36 is formed in a left portion of the first mount region 33 in an X-axis direction in the drawings. This opening 36 has an opening shape which is larger than a semiconductor chip 15.

FIG. 4B shows the frame to which the semiconductor chips and the like are fixedly attached. A semiconductor chip 14 is fixedly attached to the top surface of the first mount region 33 by use of an adhesive 20. Furthermore, as shown in FIG. 5A, an adhesive sheet material 37 is adhered to the back surface of the first mount region 33 in a way that closes the opening 36. Moreover, as indicated with circles 38 in FIG. 5B, the semiconductor chip 15 is fixedly attached to the top surface of the adhesive sheet material 37 inside the opening 36, and the end portion of the semiconductor chip 15 is placed away from the first mount region 33. Incidentally, the adhesive material 37 is formed from the same material as is the adhesive sheet material 16 of the first embodiment.

This structure makes it possible to prevent the short circuit between the two semiconductor chips 14, 15. In addition, the semiconductor chip 15 is capable of detecting the temperature rising state of the semiconductor chip 14 with much higher accuracy, since the distance by which the semiconductor chips 14, 15 are away from each other can be shortened compared with the structure in which the semiconductor chips 14, are fixedly attached to the respective discrete mount regions.

With regard to the above-described first and second embodiments, the foregoing descriptions have been provided for the case where: the one driving semiconductor chip 14 is placed in the resin package 2; and the semiconductor chip 14 is controlled by the one controlling semiconductor chip. However, the embodiments are not limited to this case.

Figure 6A:
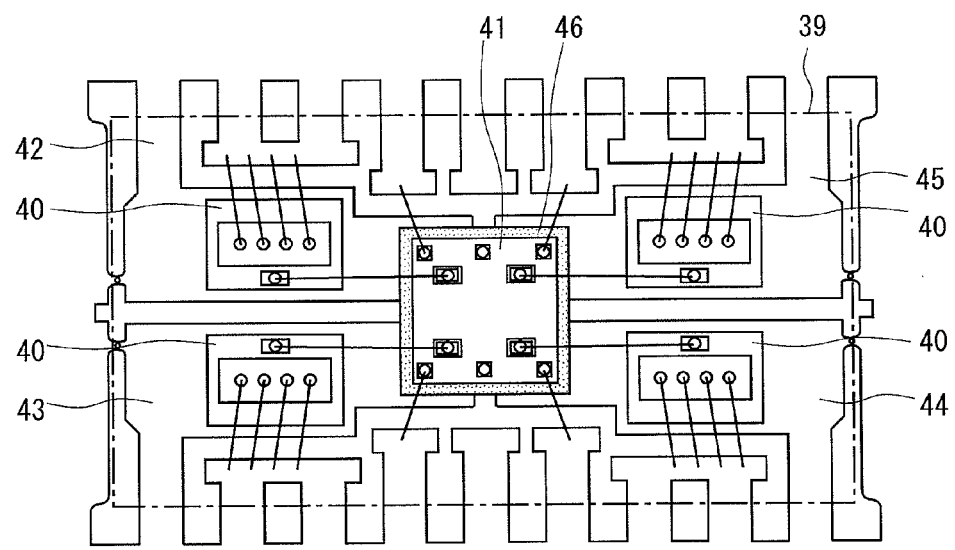
FIGS. 6A and 6B are plan views for explaining the semiconductor device of another embodiment of the present invention.

For example, as shown in FIG. 6A, an embodiment may be carried out by: placing four driving semiconductor chips 40 in a resin package indicated with a chain line 39; and controlling the four driving semiconductor chips 40 by use of one controlling semiconductor chip 41. As illustrated, the four semiconductor chips 40 are fixedly attached to the top surfaces of the respective discrete mount regions 42 to 45, while the semiconductor chip 41 is fixedly attached to the top of an adhesive sheet material 46. Furthermore, the flatness among the mount regions 42 to 45 is also maintained by the adhesive sheet material 46 in the above-described manner.

Figure 6B:
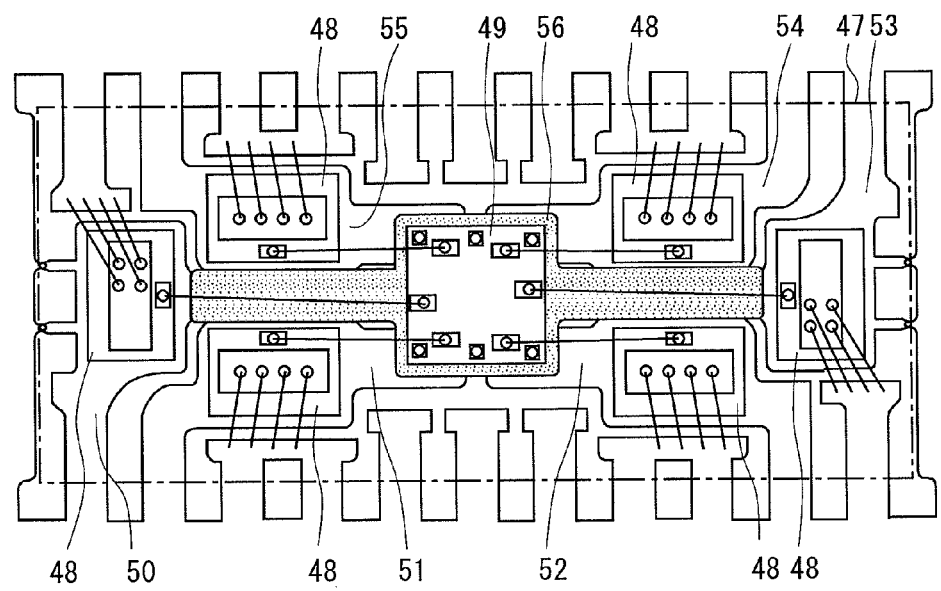
Figure 7:
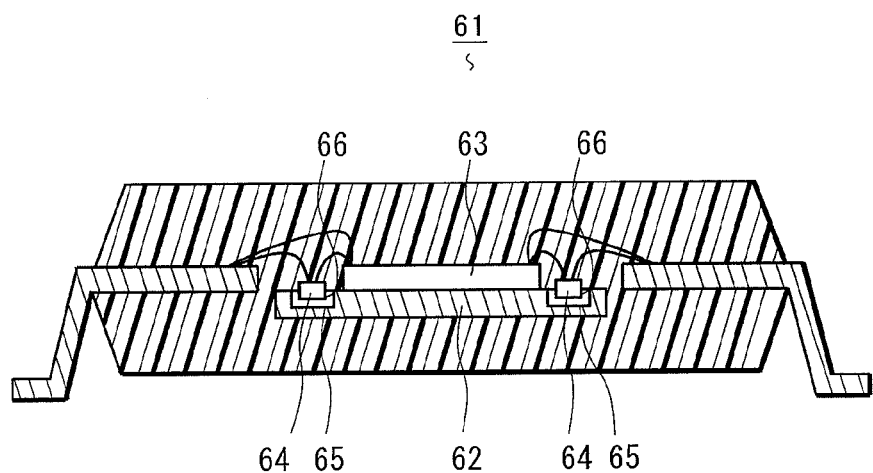
FIG. 7 is a perspective view for explaining a semiconductor device of a conventional embodiment.
Figure 8:
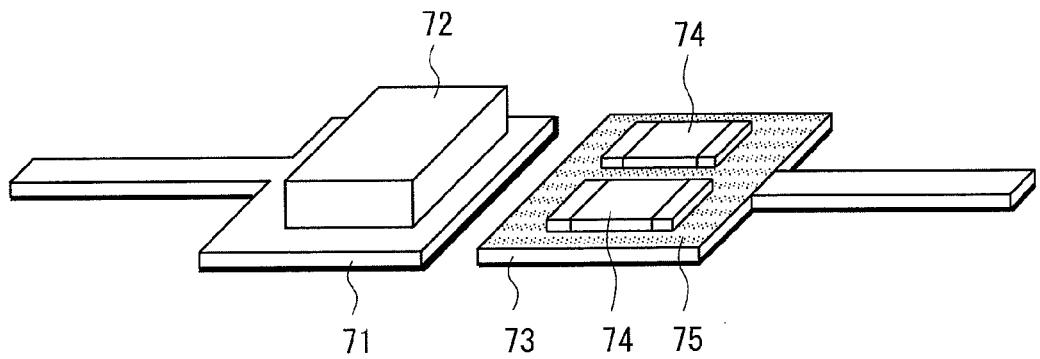
FIG. 8 is a perspective view for explaining a semiconductor device of another conventional embodiment.

Moreover, as shown in FIG. 6B, an embodiment may be carried out by: placing 6 driving semiconductor chips 48 in a resin package indicated with a chain line 47; and controlling the 6 driving semiconductor chips 48 by use of one controlling semiconductor chip 49. As in the case shown in FIG. 6A, the 6 semiconductor chips 48 are fixedly attached to the top surfaces of the respective discrete mount regions 50 to 55, while the semiconductor chip 49 is fixedly attached to the top of an adhesive sheet material 56. Furthermore, the flatness among the mount regions 50 to 55 is also maintained by the adhesive sheet material 56 in the above-described manner.

Besides, various changes may be made within the scope not departing from the gist of the present invention.

In the present invention, the driving semiconductor chip and the controlling semiconductor chip are fixedly attached to the tops of the respective discrete mount regions, and the part of the mount region to which the driving semiconductor chip is fixedly attached is placed up to under the controlling semiconductor chip. This structure enables the controlling semiconductor chip to detect the temperature of the driving semiconductor chip via the mount region.

Additionally, in the present invention, most of the end portion of the controlling semiconductor chip is placed on the second mount region. This realizes the structure which makes the driving semiconductor chip and the controlling semiconductor chip less likely to be short-circuited to each other.

Furthermore, in the present invention, the controlling semiconductor chip detects the temperature of the driving semiconductor chip accurately, and shuts down the driving semiconductor chip appropriately. This makes the driving semiconductor chip less likely to be broken down due to the heat.

Moreover, in the present invention, the mount region to which the driving semiconductor chip is fixedly attached and the mount region to which the controlling semiconductor chip is fixedly attached are placed isolated from each other. This makes it possible to apply different potentials to the respective mount regions.

What is more, in the present invention, the controlling semiconductor chip is fixedly attached to the top of the corresponding mount region by use of the insulating adhesive sheet material. This prevents the short circuit between the two semiconductor chips while maintaining the temperature detecting function of the controlling semiconductor chip.

Besides, in the present invention, the opening is formed in the mount region to which the driving semiconductor chip is fixedly attached, and the controlling semiconductor chip is fixedly attached by use of the insulating adhesive sheet material through the opening. This prevents the short circuit between the two semiconductor chips.

What is claimed is:

1. A semiconductor device comprising:
   a first mount region;
   a second mount region placed near the first mount region, and formed isolated from the first mount region;
   leads placed near the first and second mount regions;
   a first semiconductor chip fixedly attached to a top of the first mount region;
   a second semiconductor chip fixedly attached to tops of the respective first and second mount regions, and configured to control the first semiconductor chip;
   a resin sealing body covering the first and second mount regions, the leads, and the first and second semiconductor chips, wherein
   a projecting area protruding into the second mount region is formed in the first mount region, and
   the second semiconductor chip is fixedly attached to the tops of the first and second mount regions by use of an insulating adhesive sheet material in a way that at least part of the projecting area is placed under the second semiconductor chip.

2. The semiconductor device according to claim 1, wherein
   a recessed area is formed in the second mount region in a way that surrounds at least part of the projecting area, and
   the second semiconductor chip is fixedly attached to a top of the projecting area, and the top of the second mount region near the recessed area.

3. The semiconductor device according to claim 2, wherein the second semiconductor chip includes a thermal shutdown circuit configured to detect and control a temperature of the first semiconductor chip.

4. The semiconductor device according to claim 2, wherein the adhesive sheet material is formed of any one of a polyimide tape, a silicone tape and a DAF material.

5. The semiconductor device according to claim 4, wherein the adhesive sheet material is placed to extend onto the first mount region beyond a side edge of the first mount region, the side edge being opposed to the second mount region, and having the projecting area therein.

6. The semiconductor device according to claim 5, wherein the adhesive sheet material is placed to extend beyond an end portion of the second semiconductor chip toward an end portion of the second mount region.

* * * * *